United States Patent
Gonzalez et al.

(10) Patent No.: US 7,382,165 B2
(45) Date of Patent: Jun. 3, 2008

(54) METHOD FOR MATCHING SEMICONDUCTOR DEVICE BEHAVIOR

(75) Inventors: Christopher Gonzalez, Shelburne, VT (US); Vinod Ramadurai, South Burlington, VT (US); Norman Jay Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 11/466,471

(22) Filed: Aug. 23, 2006

(65) Prior Publication Data

US 2008/0048757 A1 Feb. 28, 2008

(51) Int. Cl.
*G01R 23/02* (2006.01)
(52) U.S. Cl. .......................... 327/39; 331/57
(58) Field of Classification Search ........... 331/57
See application file for complete search history.

(56) References Cited

U.S. PATENT DOCUMENTS

| | | | |
|---|---|---|---|
| 5,420,546 A * | 5/1995 | Watanabe et al. ............ | 331/57 |
| 5,903,521 A * | 5/1999 | Relph .......................... | 368/113 |
| 5,982,225 A | 11/1999 | Forhan et al. | |
| 6,476,632 B1 | 11/2002 | La Rosa et al. | |
| 7,012,459 B2 * | 3/2006 | Sutherland ................... | 327/513 |
| 7,205,854 B2 * | 4/2007 | Liu .............................. | 331/57 |
| 2002/0012272 A1 | 1/2002 | Shukuri et al. | |
| 2002/0191445 A1 | 12/2002 | Shukuri et al. | |
| 2004/0078711 A1 | 4/2004 | King et al. | |
| 2004/0223389 A1 | 11/2004 | Shukuri et al. | |
| 2005/0134394 A1 * | 6/2005 | Liu .............................. | 331/57 |
| 2005/0140418 A1 * | 6/2005 | Muniandy et al. ........... | 327/291 |

* cited by examiner

*Primary Examiner*—N. Drew Richards
*Assistant Examiner*—William Hernandez
(74) *Attorney, Agent, or Firm*—Schmeiser, Olson & Watts; Anthony J. Canale

(57) ABSTRACT

A selection circuit and method. The selection circuit comprises a logic circuit, an array of sub-circuits and a switching circuit electrically coupled to each other. The selection circuit is subjected to a first operating condition. The switching circuit selects a group of sub-circuits from the array. The selection circuit generates a first frequency. The selection circuit is subjected to a second operating condition that is different from the first operating condition and generates a second frequency. A first frequency differential between the first frequency and the second frequency is compared to a predetermined frequency differential to determine if the first frequency differential is about equal to the predetermined frequency differential.

10 Claims, 3 Drawing Sheets

METHOD FOR MATCHING SEMICONDUCTOR DEVICE BEHAVIOR

BACKGROUND OF THE INVENTION

1. Technical Field

The present invention relates to a circuit and associated method for configuring a selection circuit on a semiconductor device.

2. Related Art

Circuits within an electrical structure typically do not have the ability to be configured such that characteristics of the circuits will match characteristics of a secondary circuit. Unmatched characteristics may cause the circuits to malfunction or operate inefficiently. Thus, there is a need for a structure and associated method for producing circuits that may be configured such that characteristics of the circuits will match characteristics of a secondary circuit.

SUMMARY OF THE INVENTION

The present invention provides a method, comprising:

providing a selection circuit on a semiconductor device, said selection circuit comprising, a logic circuit, an array of sub-circuits comprising a first group of sub-circuits and a second group of sub-circuits, a first switching circuit, and a second switching circuit, wherein an output of said logic circuit is electrically connected to an input of each sub-circuit of said first group of sub-circuits, wherein an output of said each said sub-circuit of said first group is electrically connected to an input of said first switching circuit, wherein an output of said first switching circuit is electrically connected to an input of each sub-circuit of said second group of sub-circuits, wherein an output of said each of said sub-circuit of said second group is electrically connected to an input of said second switching circuit, and wherein an output of said second switching circuit is electrically connected to an input of said logic circuit;

receiving, by said logic circuit, a control signal for enabling said selection circuit;

subjecting said selection circuit to a first operating condition;

selecting, by said first switching circuit, a first sub-circuit from said first group in response to a first select signal applied to said first switching circuit;

selecting, by said second switching circuit, a second sub-circuit from said second group in response to a second select signal applied to said second switching circuit;

generating, by said selection circuit, a first frequency;

subjecting said selection circuit to a second operating condition, said second operating condition differing from said first operating condition;

generating, by said selection circuit, a second frequency; and comparing a first frequency differential between said first frequency and said second frequency to a predetermined frequency differential to determine if said first frequency is about equal to said predetermined frequency differential.

The present invention provides a selection circuit, comprising:

a logic circuit adapted to receive a control signal for enabling said selection circuit;

an array of sub-circuits comprising a first group of sub-circuits and a second group of sub-circuits, wherein an output of said logic circuit is electrically connected to an input of each sub-circuit of said first group of sub-circuits;

a first switching circuit, wherein an output of said each said sub-circuit of said first group is electrically connected to an input of said first switching circuit, wherein an output of said first switching circuit is electrically connected to an input of each sub-circuit of said second group of sub-circuits, and wherein said first switching circuit is adapted to select a first sub-circuit from said first group in response to a first select signal applied to said first switching circuit; and a second switching circuit, wherein an output of said each said sub-circuit of said second group is electrically connected to an input of said second switching circuit, wherein an output of said second switching circuit is electrically connected to an input of said logic circuit, wherein said second switching circuit is adapted to select a second sub-circuit from said second group in response to a second select signal applied to said second switching circuit, wherein said selection circuit is adapted to be subjected to a first operating condition and generate a first frequency, wherein said selection circuit is adapted to be subjected to a second operating condition and generate a second frequency, and wherein a first frequency differential between said first frequency and said second frequency is adapted to be compared to a predetermined frequency differential to determine if said first frequency differential is about equal to said predetermined frequency differential.

The present invention advantageously provides a structure and associated method for producing circuits that may be configured such that characteristics of the circuits will match characteristics of a secondary circuit.

DETAILED DESCRIPTION OF THE INVENTION

Figure 1:
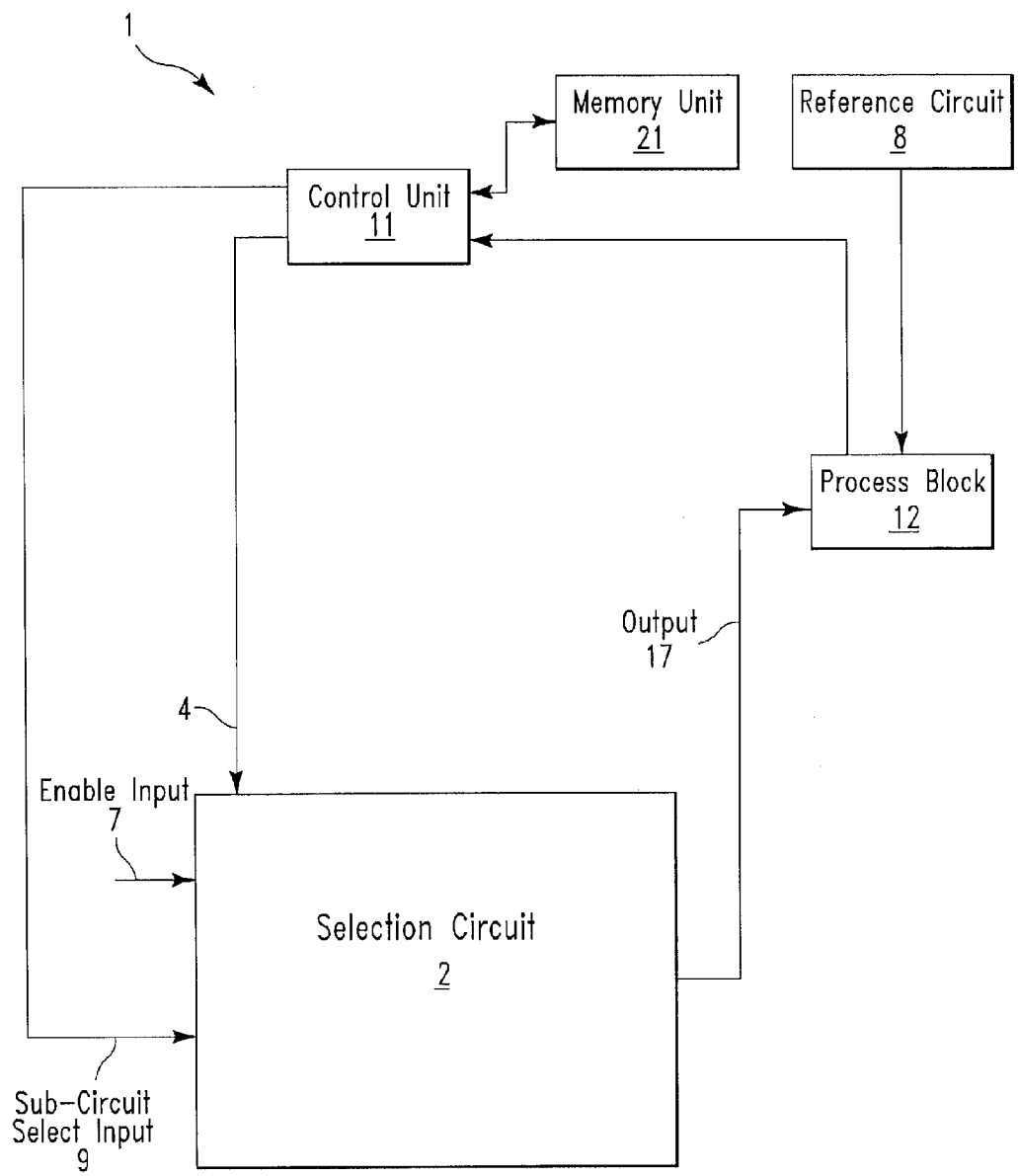
FIG. 1 illustrates a block diagram of a selection circuit on a semiconductor device, in accordance with embodiments of the present invention.

FIG. 1 illustrates a block diagram of a selection circuit 2 on a semiconductor device 1, in accordance with embodiments of the present invention. The selection circuit 2 is a configurable circuit used to generate a plurality (e.g., two) of different frequencies. Each different frequency is generated by changing configurations and operating conditions for the selection circuit 2. Operating conditions for the selection circuit 2 may include, inter alia, an operating or supply voltage, an operating or supply current, an operating temperature, etc. Configurations for the selection circuit 2 are changed by selecting different sub-circuits (e.g., see sub-circuits 10a . . . 10n, 14a . . . 14n, and 15a . . . 15n in FIG. 2) within the selection circuit 2. The selection circuit 2 may be configured such that a Δfrequency (i.e., a frequency differential) between two different generated frequencies (i.e., a difference between the two generated frequencies from selection circuit 2) will match (i.e., is about equivalent to) a specified Δfrequency (i.e., a frequency differential). The specified Δfrequency may comprise a know Δfrequency (e.g., a Δfrequency specified by a designer through testing). Alternatively, the specified Δfrequency may be generated by a reference circuit 8. The reference circuit 8 may be located on the semiconductor device 1 or external to the semiconductor device 1. The specified Δfrequency continuously changes depending on an operation of the semiconductor device 2. Therefore the selection circuit 2 is continuously re-configured to generate a Δfrequency that matches the specified Δfrequency. When an enable signal (e.g., a logical 1) is applied to an enable input 7 for the selection circuit 2, the selection circuit 2 generates a first frequency measured at output 17. The first frequency is generated and measured at a first operating condition (while using a first group of sub-circuits within the selection circuit 2) and recorded by the process block 12. The first group of sub-circuits within the selection circuit 2 are selected by applying first selection data to the sub-circuit select input 9. The first selection data is applied by the control unit 11. For example, the first operating condition may comprise a first supply voltage (e.g., 2 volts) applied to the supply input 4 for the selection circuit 2. After the first frequency is measured at the first operating condition and recorded by the process block 12, the first operating condition for the selection circuit is changed to a second operating condition (e.g., the first supply voltage of 2 volts is changed to a supply voltage of 1 volt) and a second frequency is measured and recorded by the process block 12. The process block 12 calculates a first Δfrequency between the first frequency and the second frequency and compares the first Δfrequency to the specified Δfrequency generated by the reference circuit 8. If the first Δfrequency equals the specified Δfrequency then the first selection data is stored in the memory unit 21. If the first Δfrequency does not equal the specified Δfrequency then the control unit 11 applies second selection data to the sub-circuit select input 9 and a second group of sub-circuits within the selection circuit 2 is selected. The first operating condition (e.g., 2 volts) is again applied to the selection circuit and a third frequency is measured (i.e., using the second group of sub-circuits within the selection circuit 2) and recorded by the process block 12. After the third frequency is measured at the first operating condition and recorded by the process block 12, the first operating condition for the selection circuit 2 is changed to the second operating condition (e.g., the first supply voltage of 2 volts is changed to the supply voltage of 1 volt) and a fourth frequency is measured and recorded by the process block 12. The process block 12 calculates a second Δfrequency between the third frequency and the fourth frequency and compares the second Δfrequency to the specified Δfrequency generated by the reference circuit 8. If the second Δfrequency equals the specified Δfrequency then the second selection data is stored in the memory unit 21. If the second Δfrequency does not equal the specified Δfrequency then the aforementioned process is repeated using third selection data to select a third group of sub-circuits. Note that any operating condition for the selection circuit 2 may be changed to perform the aforementioned process. For example, a temperature for the selection circuit may be changed by directing a heating source (e.g., a heater) or a cooling source (e.g., a fan, a heat sink, etc) at the selection circuit (i.e., subjecting the selection circuit to the operating condition).

Figure 2:
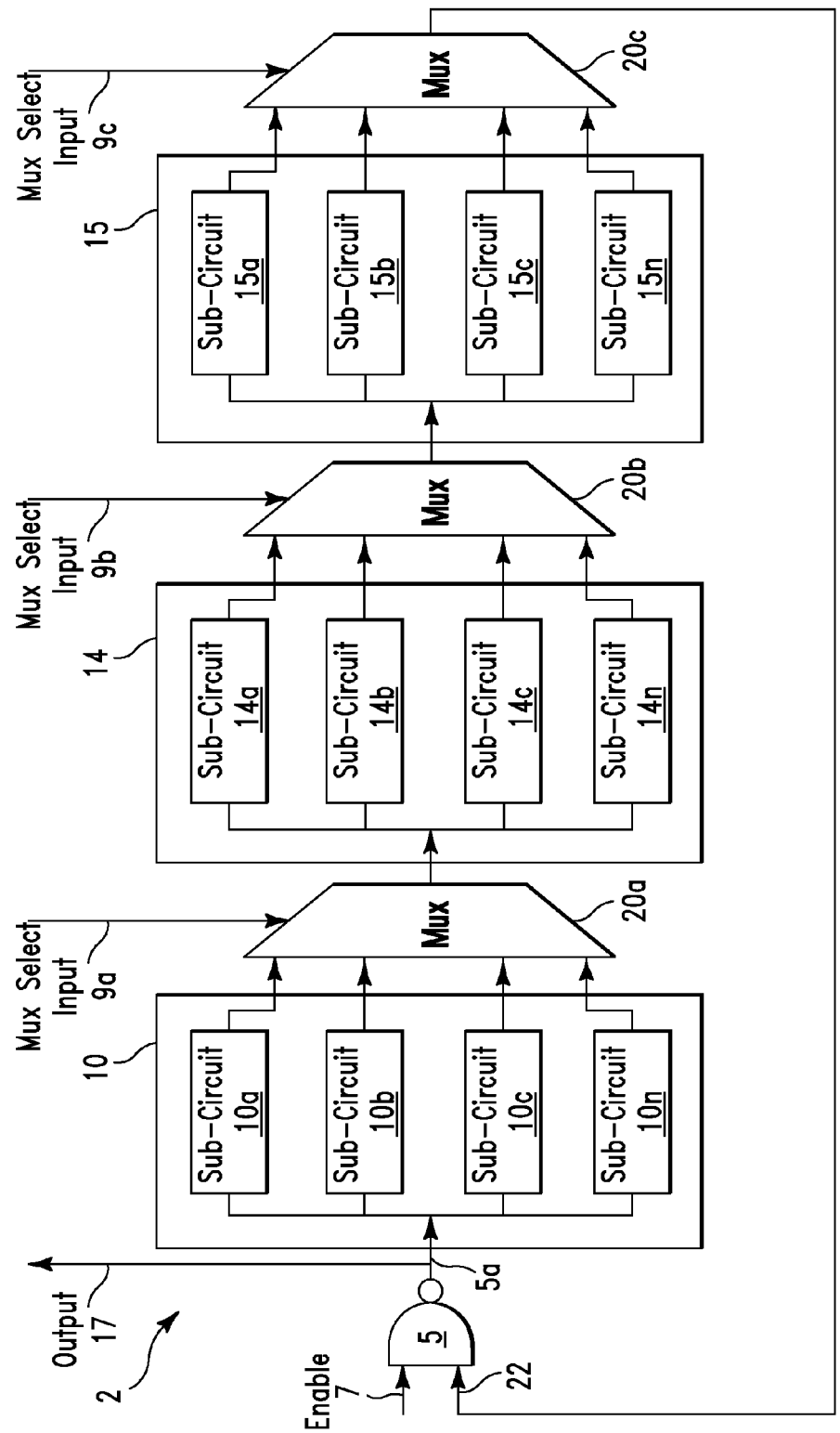
FIG. 2 illustrates an internal schematic for the selection circuit of FIG. 1, in accordance with embodiments of the present invention.

FIG. 2 illustrates an internal schematic for the selection circuit 2 of FIG. 1, in accordance with embodiments of the present invention. The internal schematic for the selection circuit 2 in FIG. 2 represents an example configuration of components for the section circuit 2. Note that any configuration of any components may be used. The selection circuit 2 in FIG. 2 is a ring oscillator circuit. The selection circuit 2 comprises a NAND gate 5, a first group 10 of sub-circuits 10*a* . . . 10*n*, a first multiplexer 20*a*, a second group 14 of sub-circuits 14*a* . . . 14*n*, a second multiplexer 20*b*, a third group 15 of sub-circuits 15*a* . . . 15*n*, and a third multiplexer 20*c*. Alternatively, the first multiplexer 20*a*, the second multiplexer 20*b*, and the third multiplexer 20*c* may be substituted by any type of switching circuit including, inter alia, an array of laser fuses, etc. The NAND gate 5 may be substituted by any type of logic gate. An output 5*a* of the NAND gate 5 is electrically connected to an input of each of sub-circuits 10*a* . . . 10*n* of the first group 10 of sub-circuits. An output of each of the sub-circuits 10*a* . . . 10*n* is electrically connected to an input of the first multiplexer 20*a*. An output of the first multiplexer 20*a* is electrically connected to an input of each of each of sub-circuits 14*a* . . . 14*n* of the second group 14 of sub-circuits. An output of each of the sub-circuits 14*a* . . . 14*n* is electrically connected to an input of the second multiplexer 20*b*. An output of the second multiplexer 20*b* is electrically connected to an input an input of each of each of sub-circuits 15*a* . . . 15*n* of the third group 15 of sub-circuits. An output of said each of the sub-circuits 15*a* . . . 15*n* is electrically connected to an input of the third multiplexer 20*c*. An output of the third multiplexer 20*c* is electrically connected to an input of the NAND gate 5 thereby forming a feedback loop. Each of the sub-circuits 10*a* . . . 10*n*, 14*a* . . . 14*n*, and 15*a* . . . 15*n* may comprise different characteristics such as, inter alia, delay, sensitivity to voltage, sensitivity to temperature, sensitivity to process, etc. Each of the sub-circuits 10*a* . . . 10*n*, 14*a* . . . 14*n*, and 15*a* . . . 15*n* may comprise any type of circuit including, inter alia, inverters, NAND gates, NOR gates, PASS gates, latches, inverters with long wires, circuits with different threshold voltages, different size circuits (e.g., big vs. small inverters), etc. The selection circuit 2 of FIG. 2 is configured such that a Δfrequency between two different generated frequencies (i.e., a difference between the two generated frequencies from selection circuit 2) will match (i.e., is about equivalent to) a specified Δfrequency as described, supra, with respect to FIG. 1.

In order to initiate the frequency generation process, a first operating condition (e.g. 2 volts) is applied to the selection circuit 2 and an enable signal (e.g., a logical 1) is applied to the enable input 7 for the NAND gate 5. In response, a first logic signal is generated on the output 5*a* of the NAND gate 5. The first logic signal is applied to each of the sub-circuits 10*a* . . . 10*n*. Each of the sub-circuits 10*a* . . . 10*n* modifies a characteristic of the first logic signal (e.g., modifying a characteristic may comprise generates different delays for the first logic signal). Next, first selection data (i.e., comprising a first mux select signal) is applied to the Mux select input 9*a* of the first multiplexer 20*a* and in response, the multiplexer 20*a* selects a signal (i.e., the first logic signal comprising a first modified characteristic) passed from one of the sub-circuits 10*a* . . . 10*n* (e.g., from circuit 10*b*). The first logic signal comprising the first modified characteristic is passed through the first multiplexer 20*a* to of the sub-circuits 14*a* . . . 14*n*. Each of the sub-circuits 14*a* . . . 14*n* modifies a characteristic of the first logic signal comprising the first modified characteristic. Next, the first selection data (i.e., comprising a second mux select signal) is applied to the Mux select input 9*b* of the second multiplexer 20*b* and in response, the multiplexer 20*b* selects a signal (i.e., the first logic signal comprising a second modified characteristic) passed from one of the sub-circuits 14*a* . . . 14*n* (e.g., from sub-circuit 14*c*). The first logic signal comprising the second modified characteristic is passed through the second multiplexer 20*b* to of the sub-circuits 15*a* . . . 15*n*. Each of the sub-circuits 15*a* . . . 15*n* modifies a characteristic of the first logic signal comprising the second modified characteristic.

Next, the first selection data (i.e., comprising a third mux select signal) is applied to the Mux select input 9a of the third multiplexer 20c and in response, the multiplexer 20c selects a signal (i.e., the first logic signal comprising a third modified characteristic) passed from one of the sub-circuits 15a . . . 15n (e.g., from sub-circuit 15n). The first logic signal comprising the third modified characteristic is passed back to an input of the NAND gate 5 and a first frequency is measured at an output 5a. The aforementioned process is repeated using a second operating condition (e.g., 1 volt) applied to the selection circuit 2 while passing the signal through the same sub-circuits (e.g., sub-circuit 10b, sub-circuit 14c, and sub-circuit 15n). As a result, a second frequency is generated and measured at output 5a. As described, supra, with respect to FIG. 1, a first Δfrequency between the first frequency and the second frequency is calculated and compared to a specified Δfrequency. If the first Δfrequency equals the specified Δfrequency then the first selection data (i.e., comprising the first, second and third mux select signals) is stored in a memory unit (e.g., memory unit 21 in FIG. 1). If the first Δfrequency does not equal the specified Δfrequency then the first operating condition (e.g. 2 volts) is again applied to the selection circuit 2 and the enable signal (e.g., a logical 1) is applied to the enable input 7 for the NAND gate 5. In response, the first logic signal is generated on the output 5a of the NAND gate 5. The first logic signal is applied to each of the sub-circuits 10a . . . 10n. Each of the sub-circuits 10a . . . 10n modifies a characteristic of the first logic signal (e.g., modifying a characteristic may comprise generating different delays for the first logic signal). Next, second selection data (i.e., comprising a fourth mux select signal) is applied to the first multiplexer 20a and in response, the multiplexer 20a selects a signal (i.e., the first logic signal comprising a fourth modified characteristic) passed from one of the sub-circuits 10a . . . 10n (e.g., from circuit 10a). The first logic signal comprising the fourth modified characteristic is passed through the first multiplexer 20a to the sub-circuits 14a . . . 14n. Each of the sub-circuits 14a . . . 14n modifies a characteristic of the first logic signal comprising the fourth modified characteristic. Next, the second selection data (i.e., comprising a fifth mux select signal) is applied to the second multiplexer 20b and in response, the multiplexer 20b selects a signal (i.e., the first logic signal comprising a fifth modified characteristic) passed from one of the sub-circuits 14a . . . 14n (e.g., from sub-circuit 14b). The first logic signal comprising the fifth modified characteristic is passed through the second multiplexer 20b to of the sub-circuits 15a . . . 15n. Each of the sub-circuits 15a . . . 15n modifies a characteristic of the first logic signal comprising the fifth modified characteristic. Next, the second selection data (i.e., comprising a sixth mux select signal) is applied to the third multiplexer 20c and in response, the multiplexer 20c selects a signal (i.e., the first logic signal comprising a sixth modified characteristic) passed from one of the sub-circuits 15a . . . 15n (e.g., from sub-circuit 15c). The first logic signal comprising the sixth modified characteristic is passed back to an input of the NAND gate 5 and a third frequency is measured at an output 5a. The aforementioned process is repeated using the second operating condition (e.g., 1 volt) applied to the selection circuit 2 while passing the signal through the same sub-circuits (e.g., sub-circuit 10a, sub-circuit 14b, and sub-circuit 15c). As a result, a fourth frequency is generated and measured at output 5a. As described, supra, with respect to FIG. 1, a second Δfrequency between the third frequency and the fourth frequency is calculated and compared to the specified Δfrequency. If the second Δfrequency equals the specified Δfrequency then the second selection data (i.e., comprising the fourth, fifth, and sixth mux select signals) is stored in a memory unit (e.g., memory unit 21 in FIG. 1). If the second Δfrequency does not equal the specified Δfrequency then the aforementioned process is repeated using third selection data to select a third group of sub-circuits. Note that any operating condition for the selection circuit 2 may be changed to perform the aforementioned process. For example, a temperature for the selection circuit may be changed by directing a heating source (e.g., a heater) or a cooling source (e.g., a fan, a heat sink, etc) at the selection circuit.

An example of implementation for the selection circuit 2 of FIGS. 1 and 2 is described as follows:

In the example there are 10 groups (similar to groups 10, 14, and 15 of FIG. 2) of sub-circuits in the selection circuit. Each group comprises 2 sub-circuits. A first sub-circuit for each group is an inverter comprising regular threshold voltage devices (RVT). A second sub-circuit for each group is an inverter comprising high threshold devices (HVT). During a manufacturing final test, a semiconductor device is tested at multiple operating conditions (e.g., 2 volts and 1 volt). The test determines that a maximum operating frequency for the semiconductor device is 2 GHz at 2 volts and 700 MHz at 1 volt. Therefore, a specified Δfrequency represents a difference of 65%. The specified Δfrequency representing the difference of 65% is the behavior that the selection circuit 2 will model. First selection data applied to the multiplexers causes half (i.e., 5) of the multiplexers to select RVT inverters and half (i.e., 5) of the multiplexers to select HVT inverters. Due to different properties comprised by the two inverter types (RVT and HVT), the inverters slow down at different rates with respect to voltage. Using the first selection data applied to the multiplexers the selection circuit frequency is measured at 2V resulting in a frequency of 100 MHz. Next, using the first selection data applied to the multiplexers the selection circuit frequency is measured at 1V resulting in a frequency of 50 MHz. A measured Δfrequency (i.e., difference between 100 MHz and 50 MHz) represents the difference of 50%. Therefore, it is determined that the specified Δfrequency is not equal to the first Δfrequency and second selection data is applied to the multiplexers (i.e., to select different sub-circuits) and the aforementioned process is repeated until a measured Δfrequency is about equal to the specified Δfrequency. The selection data that generated a 65% frequency degradation is saved to a nonvolatile memory device for retrieval in the future.

Figure 3:
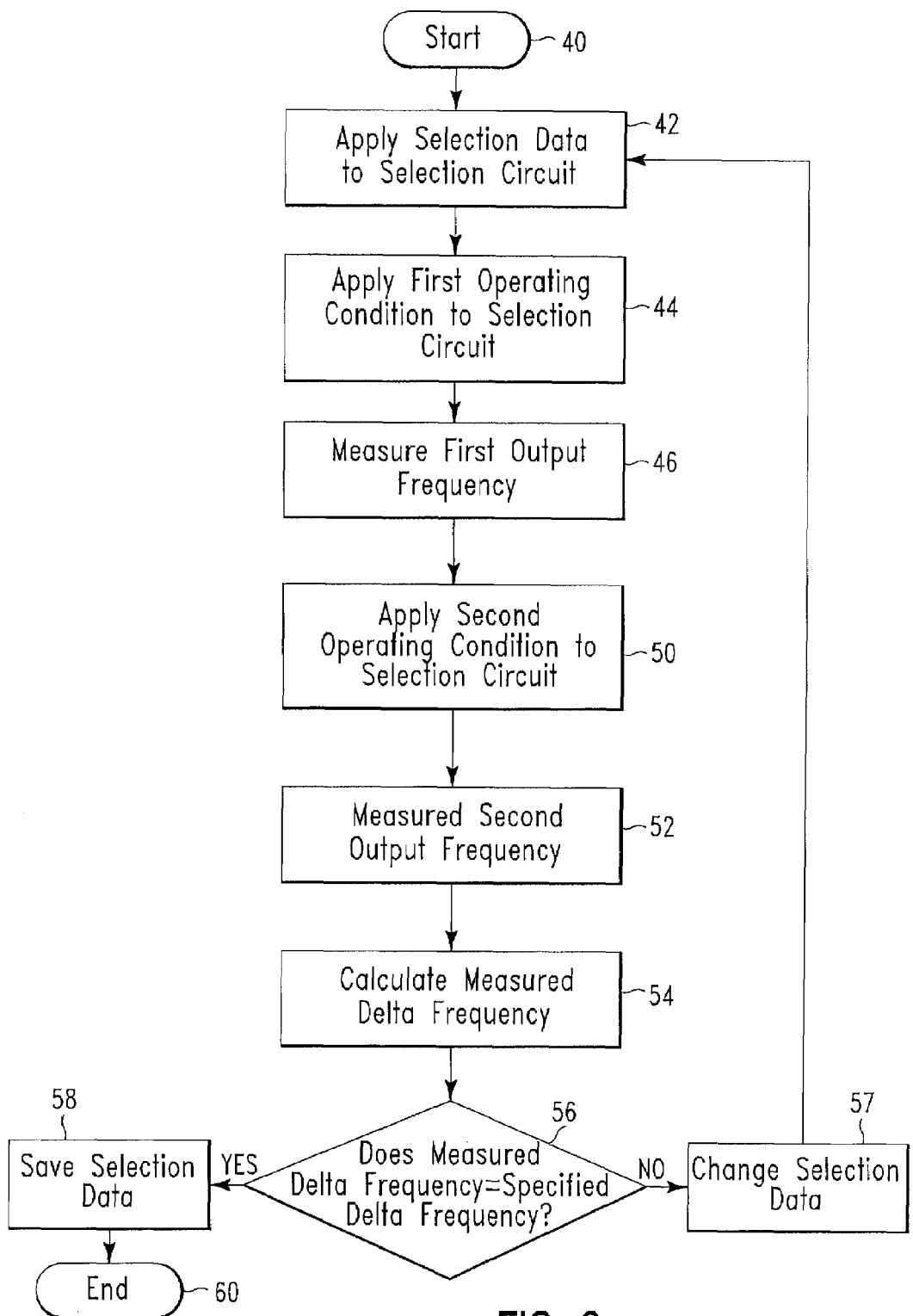
FIG. 3 is a flowchart describing an algorithm for implementing the selection circuit of FIGS. 1 and 2, in accordance with embodiments of the present invention.

FIG. 3 is a flowchart describing an algorithm for implementing the selection circuit 2 of FIGS. 1 and 2, in accordance with embodiments of the present invention. In step 40, the process is initiated. In step 42, selection data for selecting a first set of sub-circuits is applied to the selection circuit 2. In step 44, a first operating condition is applied to the selection circuit 2. In step 46, a first output frequency is measured. In step 50, a second operating condition is applied to the selection circuit 2. In step 52, a second output frequency is measured. In step 54, a measured Δfrequency between the first output frequency and the second output frequency is calculated. In step 56, it is determined if the measured Δfrequency is about equal to a specified Δfrequency. If in step 56, it is determined that the measured Δfrequency is about equal to a specified Δfrequency then in step 58 the selection data is stored for future reference and the process terminates in step 60. If in step 56, it is determined that the measured Δfrequency is not about equal to the specified Δfrequency then in step 57 the selection data is changed and step 42 is repeated. The process will keep on repeating until the measured Δfrequency is about equal to a specified Δfrequency.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method, comprising:

providing a selection circuit on a semiconductor device, said selection circuit comprising, a logic circuit, an array of sub-circuits comprising a first group of sub-circuits and a second group of sub-circuits, a first switching circuit, and a second switching circuit, wherein an output of said logic circuit is electrically connected to an input of each sub-circuit of said first group of sub-circuits, wherein an output of each sub-circuit of said first group is electrically connected to an input of said first switching circuit, wherein an output of said first switching circuit is electrically connected to an input of each sub-circuit of said second group of sub-circuits, wherein an output of each sub-circuit of said second group is electrically connected to an input of said second switching circuit, and wherein an output of said second switching circuit is electrically connected to an input of said logic circuit;

receiving, by said logic circuit, a control signal for enabling said selection circuit;

subjecting said selection circuit to a first operating condition;

selecting, by said first switching circuit, a first sub-circuit from said first group in response to a first select signal applied to said first switching circuit;

selecting, by said second switching circuit, a second sub-circuit from said second group in response to a second select signal applied to said second switching circuit;

generating, by said selection circuit, a first frequency;

subjecting said selection circuit to a second operating condition, said second operating condition differing from said first operating condition;

generating, by said selection circuit, a second frequency; and comparing a first frequency differential between said first frequency and said second frequency to a predetermined frequency differential to determine if said first frequency differential is about equal to said predetermined frequency differential.

2. The method of claim 1, wherein said comparing said first frequency differential to said predetermined frequency differential determines that said first frequency differential is about equal to said predetermined frequency differential, wherein said first select signal comprises first selection data, wherein said second select signal comprises second selection data, and wherein said method further comprises:

storing, said first selection data and said second selection data in a memory device located on said semiconductor device.

3. The method of claim 1, wherein said comparing said first frequency differential to said predetermined frequency differential determines that said first frequency differential is not about equal to said predetermined frequency differential, and wherein said method further comprises:

subjecting said selection circuit to said first operating condition;

selecting, by said first switching circuit, a third sub-circuit from said first group in response to a third select signal applied to said first switching circuit;

selecting, by said second switching circuit, a fourth sub-circuit from said second group in response to a fourth select signal applied to said second switching circuit;

generating, by said selection circuit, a third frequency;

subjecting said selection circuit to said second operating condition;

generating, by said selection circuit, a fourth frequency; and comparing a second frequency differential between said third frequency and said fourth frequency to said predetermined frequency differential to determine if said second frequency differential is about equal to said predetermined frequency differential.

4. The method of claim 3, wherein said comparing said second frequency differential to said predetermined frequency differential determines that said second frequency differential is about equal to said predetermined frequency differential, wherein said third select signal comprises third selection data, wherein said fourth select signal comprises fourth selection data, and wherein said method further comprises:

storing, said third selection data and said fourth selection data in a memory device located on said semiconductor device.

5. The method of claim 1, further comprising:

generating, by a reference circuit located on said semiconductor device, said predetermined frequency differential.

6. The method of claim 1, wherein said logic circuit comprises a NAND gate.

7. The method of claim 1, wherein each sub-circuit of said first group of sub-circuits and each sub-circuit of said second group of sub-circuits independently comprise a device selected from the group consisting of an inverter, a NAND gate, a NOR gate, as pass gate, a transmission gate, and a memory device.

8. The method of claim 1, wherein said first operating condition and said second operating condition are each independently selected from the group consisting of a specified operating voltage for said selection circuit, a specified operating temperature for said selection circuit, a specified operating frequency for said selection circuit, and a specified data flow to said semiconductor device.

9. The method of claim 1, wherein said selection circuit is a ring oscillator circuit.

10. The method of claim 1, wherein said first switching circuit and said second switching circuit each comprise a device selected from the group consisting of a multiplexer and an array of laser fuses.

* * * * *